United States Patent
Rana

(10) Patent No.: US 12,119,847 B2
(45) Date of Patent: Oct. 15, 2024

(54) NONITERATIVE ENTROPY CODING

(71) Applicant: Synaptics Incorporated, San Jose, CA (US)

(72) Inventor: Vikram Singh Rana, Cambridge (GB)

(73) Assignee: Synaptics Incorporated, San Jose, CA (US)

( * ) Notice: Subject to any disclaimer, the term of this patent is extended or adjusted under 35 U.S.C. 154(b) by 136 days.

(21) Appl. No.: 17/971,436

(22) Filed: Oct. 21, 2022

(65) Prior Publication Data

US 2024/0137045 A1 Apr. 25, 2024
US 2024/0235576 A9 Jul. 11, 2024

(51) Int. Cl.
*H03M 7/40* (2006.01)
*H03M 7/30* (2006.01)

(52) U.S. Cl.
CPC ....... *H03M 7/4093* (2013.01); *H03M 7/3079* (2013.01); *H03M 7/4006* (2013.01)

(58) Field of Classification Search
CPC . H03M 7/4093; H03M 7/3079; H03M 7/4006
USPC ........................... 341/51, 65, 67, 107
See application file for complete search history.

(56) References Cited

U.S. PATENT DOCUMENTS 9,847,791 B2 * 12/2017 Greenfield ............... H03M 7/30
9,941,900 B1 * 4/2018 Horn .................. H03M 7/6088
11,184,023 B1 11/2021 Chang et al.
2017/0164007 A1 6/2017 Converse
2020/0413106 A1 12/2020 Gladding et al.

OTHER PUBLICATIONS

Duda, Jarek, "Asymmetric numeral systems," May 21, 2009, https://arxiv.org/pdf/0902.0271.pdf, 47 pages.
Duda, Jarek, "Asymmetric numeral systems: entropy coding combining speed of Huffman coding with compression rate or arithmetic coding," Jan. 6, 2014, https://arxiv.org/pdf/1311.2540.pdf, 24 pages.
Rissanen, J., "Arithmetic Coding," IBM J. Res. Develop. vol. 23, No. 2, Mar. 1979, 14 pages.
Bodner, Benjamin, "BB-ANS coding, "Decoding" the State-of-the-art Coding Method," May 4, 2020, https://medium.com/beyondminds/bb-ans-coding-7b9d512cc841, 18 pages.
Tatwawadi, Kedar, "What is Asymmetric Numeral Systems?," Accessed Oct. 21, 2022, https://kedartatwawadi.github.io/post--ANS/, 16 pages.

* cited by examiner

*Primary Examiner* — Khai M Nguyen
(74) *Attorney, Agent, or Firm* — Paradice & Li LLP

(57) ABSTRACT

This disclosure provides methods, devices, and systems for data compression and decompression. The present implementations more specifically relate to entropy encoding and decoding techniques for keeping a state variable within upper and lower bounds using a noniterative process. The entropy encoding uses a fixed state threshold to determine a number of bits to remove and removes the bits from a current state prior to encoding a symbol with the current state. The entropy decoding decodes encoded data in a bitstream based on a current state to obtain the symbol and a new state and determines a number of bits to read from the bitstream and to add to the new state to update the current state.

20 Claims, 7 Drawing Sheets

NONITERATIVE ENTROPY CODING

TECHNICAL FIELD

The present implementations relate generally to data compression and decompression, and specifically to entropy coding using a noniterative Asymmetric Numeral System.

BACKGROUND OF RELATED ART

Data compression is a technique for encoding information into (generally) smaller units of data. As such, data compression can be used to reduce the bandwidth or overhead needed to store or transmit such information over a communications channel (such as a wired or wireless medium). For example, an encoder encodes or compresses the information into a sequence of coded bits (also referred to as a "codeword") and a decoder subsequently decodes or decompresses the codeword to recover the original information. Data compression techniques can be generally categorized as "lossy" or "lossless." Lossy data compression may result in some loss of information between the encoding and decoding of such information. In contrast, no information is lost as a result of encoding or decoding such information using lossless data compression.

Entropy coding is a form of lossless data compression that encodes data values (or "symbols") into codewords of varying lengths based on the probability of occurrence of each symbol. For example, data symbols that have a higher probability of occurrence may be encoded into shorter codewords than data symbols that have a lower probability of occurrence. The current state-of-the-art entropy coding methods are Asymmetric Numeral System (ANS) and Arithmetic Coding (AC). Both ANS and AC are asymptotically optimal and, given enough symbols, approach Shannon information bounds. However, such encoding methods are intensive from a computation and memory bandwidth perspective and suffer from reduced performance in, e.g., a single instruction, multiple data (SIMD) parallel implementation, due to utilized processing techniques.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

The present implementations relate to entropy encoding and decoding techniques for keeping the state variable within upper and lower bounds using a noniterative process. The entropy encoding, for example, uses a fixed state threshold to determine a number of bits to remove and removes the bits from a current state prior to encoding a symbol with the current state. The entropy decoding decodes encoded data in a bitstream based on a current state to obtain the symbol and a new state and determines a number of bits to read from the bitstream and to add to the new state to update the current state.

One innovative aspect of the subject matter of this disclosure can be implemented in a method performed by an encoder. The method of data encoding includes obtaining a current state for encoding a symbol; obtaining a fixed state threshold; determining a total number of bits to remove from the current state based on the fixed state threshold; encoding the current state with the symbol after removing the total number of bits from the current state to generate a new state; generating a bitstream based on the new state and the bits removed from the current state; and transmitting the bitstream to a decoder.

One innovative aspect of the subject matter of this disclosure can be implemented in an encoder configured for data encoding that includes at least one memory and a processing system that includes one or more processors coupled to the at least one memory, the processing system configured to obtain a current state for encoding a symbol; obtain a fixed state threshold; determine a total number of bits to remove from the current state based on the fixed state threshold; encode the current state with the symbol after removing the total number of bits from the current state to generate a new state; generate a bitstream based on the new state and the bits removed from the current state; and transmit the bitstream to a decoder.

One innovative aspect of the subject matter of this disclosure can be implemented in a method performed by a decoder. The method of data decoding includes obtaining a fixed lower bound for states; obtaining a current state; receiving a bitstream from an encoder, the bitstream comprising a state encoded with a number of symbols and a series of bits removed from the state as part of the encoding process; decoding the state based on the current state to generate a new state and obtain a symbol; determining a total number of bits removed for the state for the symbol and to be read from the bitstream into the new state based on the new state and the fixed lower bound; and reading the total number of bits from the bitstream into the new state.

One innovative aspect of the subject matter of this disclosure can be implemented in a decoder configured for data decoding that includes at least one memory and a processing system that includes one or more processors coupled to the at least one memory, the processing system configured to obtain a fixed lower bound for states; obtain a current state; receive a bitstream from an encoder, the bitstream comprising a state encoded with a number of symbols and a series of bits removed from the state as part of the encoding process; decode the state based on the current state to generate a new state and obtain a symbol; determine a total number of bits removed for the state for the symbol and to be read from the bitstream into the new state for the symbol based on the new state and the fixed lower bound; and read the total number of bits from the bitstream into the new state.

BRIEF DESCRIPTION OF THE DRAWINGS

The present implementations are illustrated by way of example and are not intended to be limited by the figures of the accompanying drawings.

DETAILED DESCRIPTION

Figure 1:
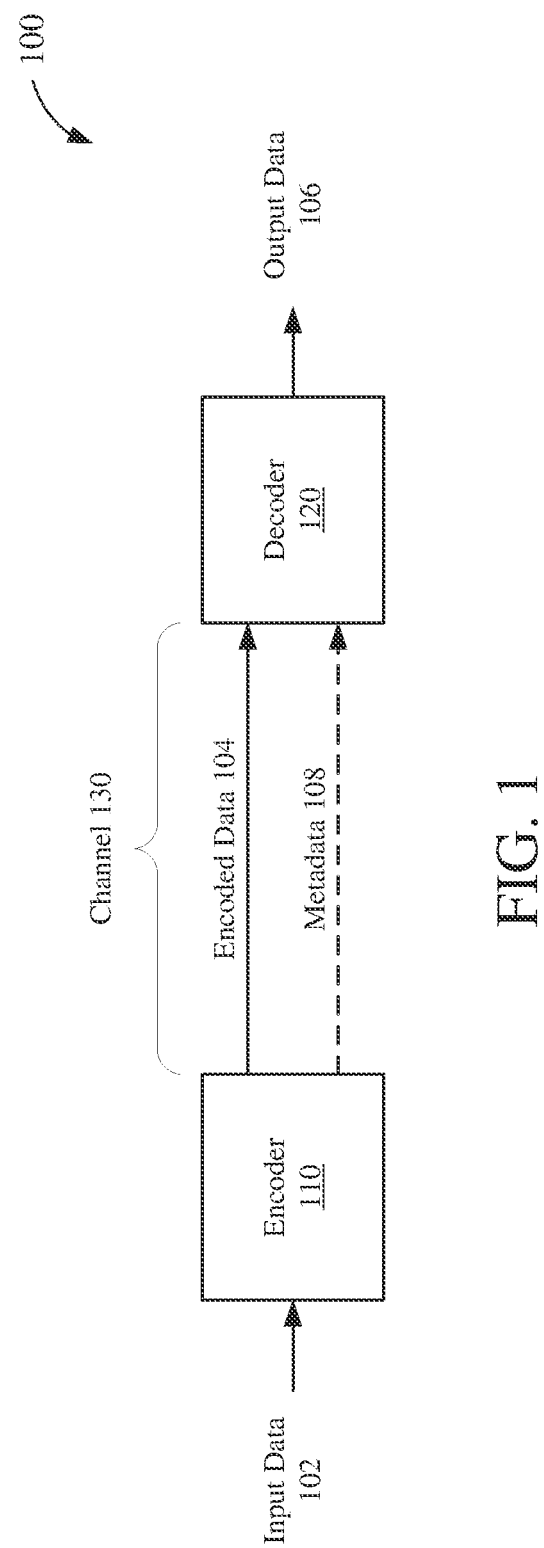
FIG. 1 shows an example communication system for encoding and decoding data.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing, and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium including instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random-access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits, and instructions described in connection with the embodiments disclosed herein may be executed by one or more processors (or a processing system). The term "processor," as used herein may refer to any general-purpose processor, special-purpose processor, conventional processor, controller, microcontroller, and/or state machine capable of executing scripts or instructions of one or more software programs stored in memory.

As discussed above, the current state-of-the-art entropy coding methods are Asymmetric Numeral System (ANS) and Arithmetic Coding (AC). Both ANS and AC are asymptotically optimal and, given enough symbols, they approach Shannon information bounds. Both schemes, however, utilize processing techniques that are intensive from a computation and memory bandwidth perspective. Specifically, these entropy coding methods use an iterative approach, i.e., conditional loops, for removing (sometimes referred to as dumping) and reading bits from a bitstream. Conditional loops are computationally intensive and are demanding from a memory bandwidth perspective. Additionally, conditional loops run an indeterminate number of times where all the threads of work cannot progress beyond the loop until all loops have satisfied their conditions, which significantly reduces the performance of, e.g., a SIMD parallel implementation. Aspects of the present disclosure recognize that the conditional loops utilized in entropy coding system, such as ANS, may be avoided by using a noniterative processing technique.

Various aspects relate generally to data encoding and decoding, and more particularly, to entropy encoding and decoding techniques using noniterative processing techniques. In some aspects, an entropy encoder may obtain a current state for encoding a symbol and obtain a fixed state threshold. For example, the fixed state threshold may be obtained based on an upper bound for states divided by a fixed denominator of probabilities associated with symbols to be encoded. The entropy encoder determines a total number of bits to remove from the current state, if any, based on the fixed state threshold. For example, the entropy encoder may generate a threshold associated with the symbol based on the fixed state threshold and a probability of the symbol and determine if the current state is above the threshold. If the current state is not above the threshold the total number of bits is zero, and otherwise, the entropy encoder determines the total number of bits to remove from the bitstream, e.g., using a difference in leading 0s of the current state and the threshold associated with the symbol and an integer number of words, which is a fixed size group of bits handled as a unit when removed from states. The entropy encoder encodes the current state with the symbol after removing the total number of bits, if any, from the current state to generate a new state and generates a bitstream based on the new state and any bits removed from the current state. For example, in some implementations, e.g., when multiple encodes are performed, a final new state may be generated based on all previously determined new states and the bitstream may include only the final new state and any bits removed from all previously determined new states. The bitstream may then be transmitted to an entropy decoder.

In some aspects, an entropy decoder may obtain a fixed lower bound for states and may obtain a current state. The entropy decoder receives a bitstream from an entropy encoder. The bitstream, for example, includes a state encoded with a symbol and total number of bits removed from the state by the entropy encoder before encoding the state with the symbol. For example, in some implementations, e.g., when multiple encodes were performed, the bitstream may include only a final new state that is generated based on a plurality of previously determined states and any bits removed from all previously determined states. The entropy decoder decodes the state based on the current state to generate a new state and to obtain the symbol. The entropy decoder determines the total number of bits, which was removed from the state by the entropy encoder, based on the new state and the fixed lower bound. For example, the total number of bits may be determined by determining if the new state is below the fixed lower bound. If the new state is not below the fixed lower bound, the total number of bits is zero, and otherwise, the entropy decoder determines the total number of bits, e.g., using a difference in leading 0s of the new state and the fixed lower bound and an integer number of words, which is a fixed size group of bits handled as a unit when removed from states. The entropy decoder may then read the total number of bits from the bitstream into the new state.

Particular implementations of the subject matter described in this disclosure can be implemented to realize one or more of the following potential advantages. The encoding and decoding techniques of the present disclosure avoids the use of iterative conditional loops and their attendant disadvantages. For example, the proposed scheme eases computation requirements and requires at most, one write to bitstream memory when encoding and two reads from bitstream memory when decoding. With reduced computation and memory requirements, fast and easy to implement entropy encoders/decoders may be used to enable numerous applications such as, e.g., low-latency processing and compression of images and videos at high quality and resolution levels (e.g., 4K and 8K) as well as allow their hardware implementation in resource constrained architectures. Moreover, with the proposed noniterative scheme, the threads of work can progress without waiting for the conditions of nondeterministic loops to be satisfied, thereby allowing further optimization and parallelization of the encoding and decoding process, e.g., in a full utilization of a SIMD parallel implementation.

FIG. 1 shows an example communication system 100 for encoding and decoding data. The communication system 100 includes an encoder 110 and a decoder 120. The encoder 110 and the decoder 120 may be provided in respective communication devices such as, for example, computers, switches, routers, hubs, gateways, cameras, displays, or other devices capable of transmitting or receiving communication signals.

The encoder 110 receives input data 102, which is encoded and transmitted or stored via a channel 130. For example, the channel 130 may include a wired or wireless transmission medium that facilities communications between the encoder 110 and the decoder 120. Alternatively, or in addition, the channel 130 may include a data storage medium. In some aspects, the encoder 110 may be configured to compress the size of the input data 102 to accommodate the bandwidth, storage, or other resource limitations associated with the channel 130. For example, the encoder 110 may encode each unit of input data 102 as a respective "codeword" that can be transmitted or stored over the channel 130 (as encoded data 104). The decoder 120 is configured to receive the encoded data 104 via the channel 130 and decode the encoded data 104 as output data 106. For example, the decoder 120 may decompress or otherwise reverse the compression performed by the encoder 110 so that the output data 106 is substantially similar, if not identical, to the original input data 102.

Data compression techniques can be generally categorized as "lossy" or "lossless." Lossy data compression may result in some loss of information between the encoding and decoding steps. As such, the output data 106 may be different than the input data 102. In contrast, lossless data compression does not result in any loss of information between the encoding and decoding steps as long as the channel 130 does not introduce errors into the encoded data 104. As a result of lossless compression, the output data 106 is identical to the input data 102. Entropy encoding is a form of lossless data compression that encodes data values (or "symbols") into codewords of varying lengths based on the probability of occurrence of each data symbol. For example, data symbols that have a higher probability of occurrence may be encoded into shorter codewords than data symbols that have a lower probability of occurrence. Example entropy encoding techniques including, among other examples, Asymmetric Numeral System (ANS) and Arithmetic Coding (AC), as well as Huffman coding, and Golomb coding.

Many entropy coding techniques (such as ANS and AC) rely on probability tables to encode and decode data symbols. Each row of a probability table indicates a probability distribution of a respective subset of symbols (also referred to as a "context"). More specifically, each entry in a given row of the probability table indicates a frequency of a respective symbol associated with the corresponding context. Thus, the sum of all entries in the row indicates the total frequency of all symbols associated with a particular context. In some aspects, the encoder 110 may transmit or store via the channel 130 metadata 108 that the decoder 120 may use to decode the encoded data 104. For example, the metadata 108 may include probability tables associated with the encoded data 104, an upper bound, a lower bound, denominators, etc. The probability tables for example, indicate the probability distributions of the encoded data symbols and may be used by the decoder 120 to recover the output data 106 from the encoded data 104. The upper bound, lower bound, and denominators may be used to produce encoded symbols to produce encoded data 104 and decode the encoded data 104 using a deterministic approach to avoid a conditional loop for keeping the state variable within the lower bound and upper bound.

Figure 2:
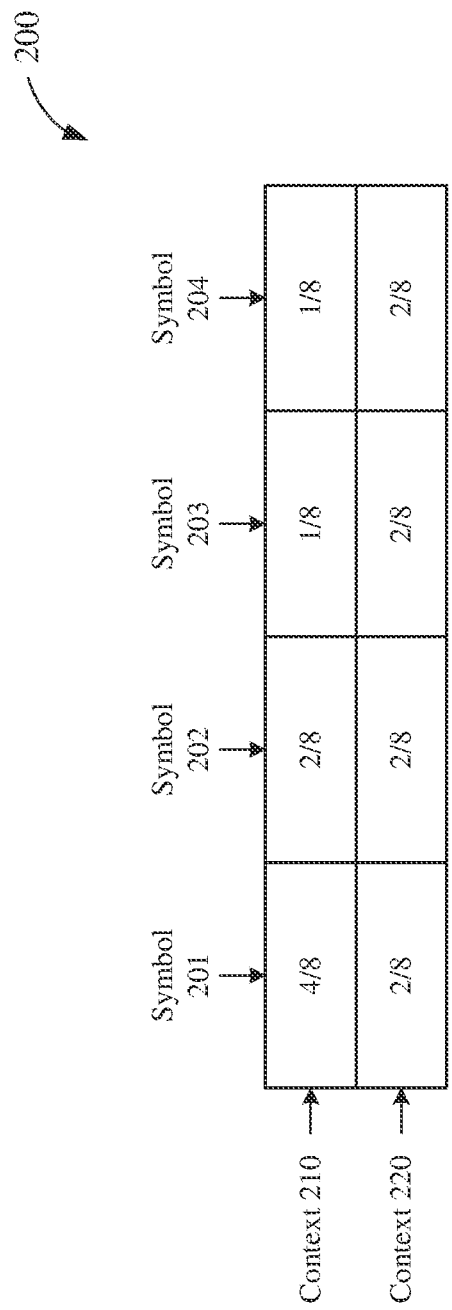
FIG. 2 shows an example probability table associated with an entropy coding scheme.

FIG. 2 shows an example probability table 200 associated with an entropy coding scheme. The probability table 200 includes a number of entries arranged in rows and columns. More specifically, each row of the probability table 200 represents a respective context and each column of the probability table 200 represents a respective symbol. For simplicity, only two contexts 210 and 220 and four symbols 201-204 of the probability table 200 are depicted in FIG. 2. However, the probability table 200 may include any number of contexts and any number of symbols associated with each context.

The entries in each row of the probability table 200 indicate a probability distribution of the symbols 201-204 associated with a respective context 210 or 220. For example, the entries in the first (or top) row of the probability table 200 indicate a probability distribution of the symbols 201-204 associated with the first context 210. In the example of FIG. 2, the first symbol 201 associated with the first context 210 is shown to occur with a probability equal to 4/8; the second symbol 202 associated with the first context 210 is shown to occur with a probability equal to 2/8; the third symbol 203 associated with the first context 210 is shown to occur with a probability equal to 1/8; and the fourth symbol 204 associated with the first context 210 is shown to occur with a probability equal to 1/8.

The entries in the second (or bottom) row of the probability table 200 indicate probability distribution of the symbols 201-204 associated with the second context 220. In the example of FIG. 2, the first symbol 201 associated with the second context 220 is shown to occur with a probability equal to 2/8; the second symbol 202 associated with the second context 220 is shown to occur with a probability equal to 2/8; the third symbol 203 associated with the second context 220 is shown to occur with a probability equal to 2/8; and the fourth symbol 204 associated with the second context 220 is shown to occur with a probability equal to 2/8. The entries in each row of the probability table 200 have a total probability of occurrence equal to 1.

As shown in FIG. 2, each entry in the probability table 200 is a proportion (or probability value) defined by a numerator and a denominator. The numerator represents the frequency of a respective symbol associated with a given context and the denominator represents the total frequency of all symbols associated with the context. Thus, entries in the same row of the probability table 200 have the same denominator. In some implementations, the denominator associated with each row (or context) of the probability table 200 may be known to an entropy encoder (such as the encoder 110 of FIG. 1) and to an entropy decoder (such as the decoder 120 of FIG. 1). As such, the entropy encoder may transmit only the frequency values (or numerators). associated with each entry of the probability table 200 to the entropy decoder.

ANS, for example, is an algorithm where a state variable, represented as an integer, is used to encode symbols. Each symbol has an associated fixed probability (represented as a rational number with a fixed denominator). When encoded, the state variable increases in size inversely proportional to the fixed probability of the associated symbol, i.e., the more probable the symbol, the smaller increase in size of the state. In ANS, the state is a "bitstream" that is an arbitrarily sized integer, which expands as more symbols are encoded. The rate of expansion is slower when more probable symbols are being encoded, and vice versa. Arbitrary-precision arithmetic may be avoided using variants of ANS, such as range ANS (rANS). In rANS, for example, lower and upper bounds of the state are defined, and bits moved to and from a bitstream to maintain these bounds.

With conventional rANS, to prevent the state variable from growing too large, it is kept within lower and upper bounds using a conditional loop. For example, if the encode operation pushes the state above the upper bound, some of the lower bits may be dumped to a bitstream and the state variable is shifted down, deleting those bits. During encoding, the conditional loop is performed until the new state falls within the acceptable range. Conversely, if a decode pushes the state below some lower bound, bits are read from the bitstream and appended to the lower bits of the state, until the state falls back into the correct range. During decoding the conditional loop for decoding is performed until the new state falls within the acceptable range. Thus, the standard rANS operation uses an iterative process to keep the state variable within lower and upper bounds.

As discussed herein, normalization during encoding and decoding may be performed deterministically, thereby avoiding the conditional loops used in an iterative normalization process in a conventional rANS process.

In the notation sometimes used herein: $s_k$ denotes the digit currently being encoded/decoded, where k starts from 1, and $X_k$ denotes the message (state) after encoding/before decoding digit $s_k$, where $X_{k-1}$ denotes the message (state) before encoding/after decoding digit $s_k$, and $X_0$ denotes the initial state of the message. Additionally, B denotes the base being encoded in, where choosing B such that it is a power of 2, which is denoted as $2^b$, the slots will be exactly b bits in length, meaning standard bitstream reading/writing operations may be used. Moreover, as used herein F(x) is defined as denoting the first set bit in the binary representation of some unsigned integer x, so that F(x)=0 if only the least significant bit (LSB) is set, i.e., x=1, and F(x)=1 if the second LSB is the highest set bit, i.e., x∈{2, 3}, and F(0) is undefined.

For encoding or decoding a symbol as discussed herein, the threshold that will require dumping (removing) or inverse dumping at least one bit may be determined. If the state exceeds this threshold, the number of bit shifts that are required before the state and threshold meet (e.g., share the same most significant bit (MSB)) is determined. The number of shifts may be rounded up to the nearest b, which will be the amount of dumps/inverse dumps required, or one additional b may be required. The state may be adjusted accordingly, thereby avoiding the iterative process.

Figure 3:
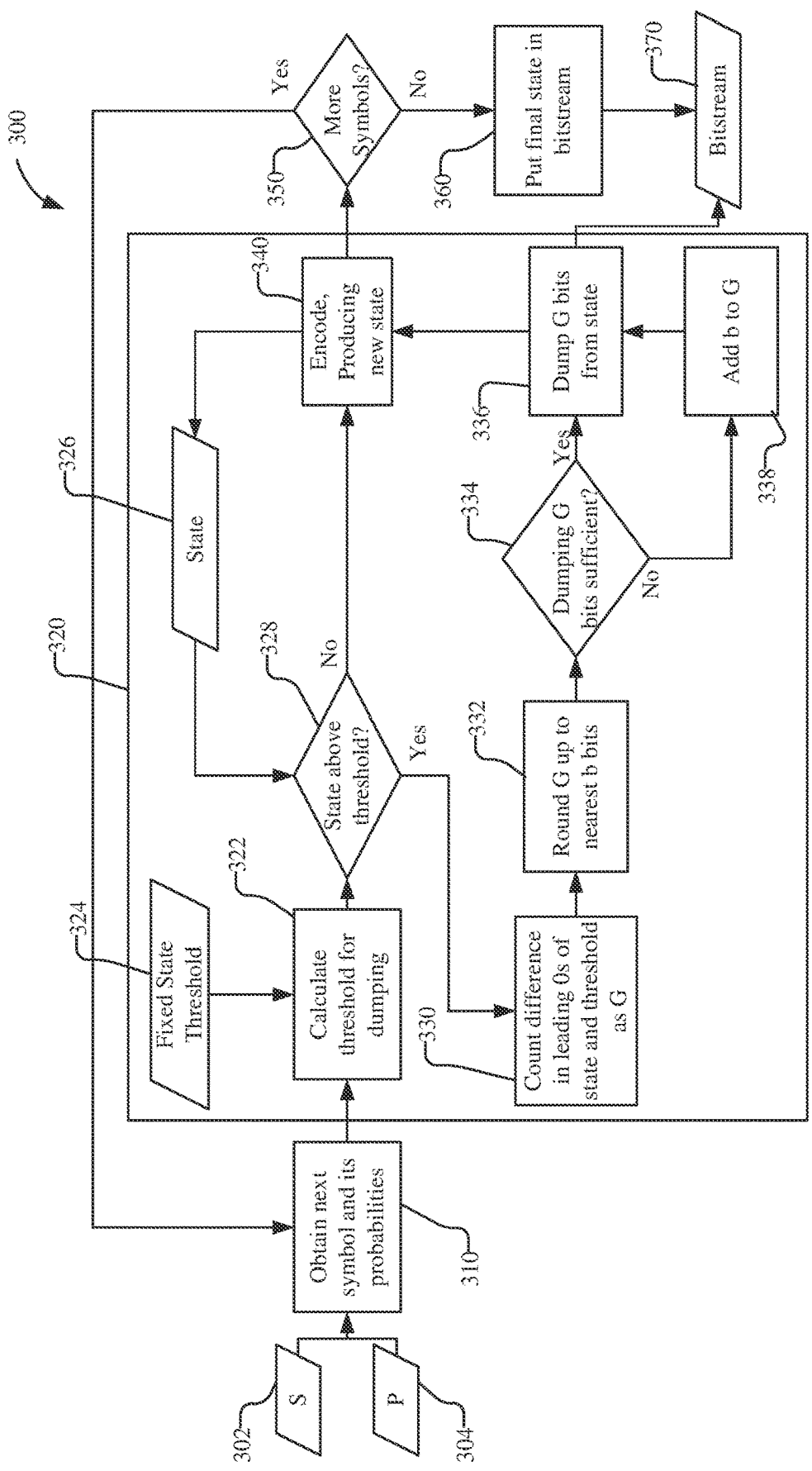
FIG. 3 shows an example an entropy encode process implemented by an encoder using a deterministic approach to keeping the size of the state variable less than an upper bound before symbols are encoded in a noniterative process.

FIG. 3 shows an example an entropy encode process 300 implemented by an encoder using a deterministic approach to keeping the size of the state variable less than an upper bound before symbols are encoded.

As shown in FIG. 3, symbols (302) and probabilities (304) associated with the symbols (302) are received. The symbols 302, for example, is input data to be encoded, such as input data 102 shown in FIG. 1. The probabilities (304) may be a probability table, such as probability table 200 shown in FIG. 2.

The next symbol and its probability are obtained (310) from the symbols (302) and probabilities (304) and a noniterative normalization process (320) is performed. As illustrated, a threshold is calculated for dumping (322). For example, the threshold $T_{p(s)}$ associated with the symbol to be encoded is determined based on a fixed state threshold (324), e.g., a base threshold $T_{base}$, multiplied by the symbol probability p(s). The base threshold $T_{base}$ may be precalculated based on the (exclusive) upper bound, e.g., IB, which may be defined by I denoting the (inclusive) lower bound of the state variable, and B denoting the base which is used to dump bits, and the probability denominator M, e.g., as IB//M (where // indicates divide). The threshold associated with a symbol $T_{p(s)}$ can be found by multiplying the precomputed base threshold $T_{base}$ by probability of the symbol p(s).

The current state $X_{k-1}$ (326) is checked to determine if is above the threshold $T_{p(s)}$ associated with the symbol (328), e.g., $X_{k-1} \geq T_{p(s)}$. If the current state $X_{k-1}$ is above the threshold $T_{p(s)}$, then the guess value G is determined by counting the difference in leading 0s of the current state $X_{k-1}$ and the threshold $T_{p(s)}$ (330), e.g., $G=F(X_{k-1})-F(T_{p(s)})$. The value of G is rounded up to the nearest multiple of b (332), e.g., ((G+b−1)//b)×b. A check is performed to determine if dumping (removing) G bits from the current state $X_{k-1}$ is sufficient (334). For example, the check determines if the shifted state is less than the associated threshold, e.g., $(X_{k-1}>>G)<T_{p(s)}$ (where >> indicates right shift). If dumping G bits is sufficient, then G bits are removed from the current state $X_{k-1}$ (336). If dumping G bits is not sufficient, then G is increased by a block bits b (i.e., word) (338), and the G bits are removed from the current state $X_{k-1}$ (336). After G bits are dumped from the current state $X_{k-1}$, the dumped G bits are added to the bitstream (370) as discussed above, and the symbol is encoded using the current state $X_{k-1}$ to produce a new state $X_k$ (340), e.g., using the ANS encoding process, and the new state $X_k$ is output and stored as the new current state (326).

If the current state $X_{k-1}$ is determined to be not above the threshold $T_{p(s)}$ (328), then there are no bits that need to be removed from the current state $X_{k-1}$ and the symbol is encoded using the current state $X_{k-1}$ to produce a new state $X_k$ (340), e.g., using the ANS encoding process, and the new state $X_k$ is output and stored as the new current state (326).

The process checks to see if there are more symbols to be encoded (350), and if so, the process returns to obtain the next symbol and its probability (310). If there are no further symbols to be encoded, the final state is placed in a bitstream (360) and the bitstream (370) (including the final state and dumped bits) may be transmitted to the decoder (or otherwise stored), e.g., via channel 130, illustrated in FIG. 1.

Figure 4:
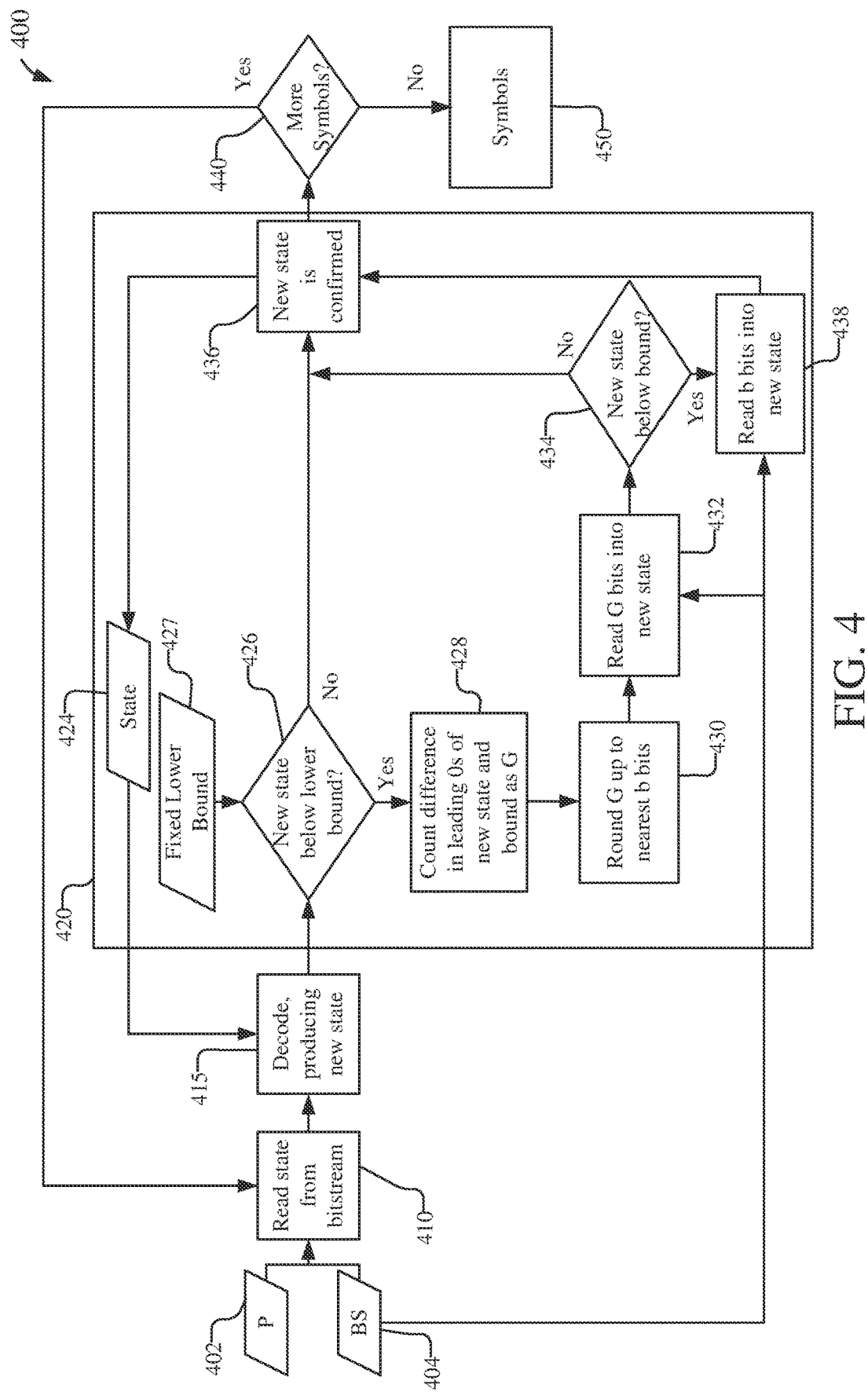
FIG. 4 shows an example an entropy decode process implemented by a decoder using a deterministic approach to keeping the size of the state variable more than or equal to a lower bound after symbols are decoded in a noniterative process.

FIG. 4 shows an example an entropy decode process 400 implemented by a decoder using a deterministic approach to keeping the size of the state variable more than or equal to a lower bound after symbols are decoded.

As shown in FIG. 4, probabilities (402) associated with symbols and the bitstream (404) are received from the encoder, e.g., via channel 130 illustrated in FIG. 1. The probabilities (402) may be a probability table, such as probability tables in the metadata 108 shown in FIG. 1 and probability table 200 shown in FIG. 2. The bitstream (404) may be generated using the encoding process 300 shown in FIG. 3.

The state is read from the bitstream (410) and the symbol is decoded (415) from the state based on the current state $X_k$ (424), producing the symbol and a new state $X_{k-1}$, e.g., using the ANS decoding process. Using ANS, the symbols are decoded in the opposite order in which they were encoded. Thus, the bitstream 404 is read in the opposite direction as it is written.

A noniterative normalization process (420) is performed on the new state $X_{k-1}$. A check (426) is performed to determine if the new state $X_{k-1}$ is below fixed lower bound I for states (427), e.g., $X_{k-1}<I$. If the new state $X_{k-1}$ is below fixed lower bound I, a first guess value (G) is determined (428) by counting the difference in leading 0s of the new state $X_{k-1}$ and the lower bound I, e.g., based on $F(I)-F(X_{k-1})$. The value of G is rounded up to the nearest multiple of b (430), e.g., ((G+b−1)//b)×b. The G bits are read from the bitstream 404 and added to the new state $X_{k-1}$ (432), and a check is performed to determine if the new state with $X_{k-1}$ is still below the lower bound I (434), e.g., check if $(X_{k-1}<<G)+read(G) \geq I$ (where << indicates left shift). If the new state $X_{k-1}$ is no longer below the lower bound I, the new state is confirmed (436) and stored as the current state (424) and the symbol is produced. If the new state $X_{k-1}$ is still below the lower bound I, then another block of bits b (word) is read from the bitstream 404 and added to the new state $X_{k-1}$ (438), and the new state is confirmed (436) and stored as the current state (424) and the symbol is produced.

The process checks to see if there are more symbols to be decoded (440), and if so, the process returns to read a state from the bitstream (410). If there are no further symbols to be decoded, the symbols are produced (450), e.g., as the output data 106 in FIG. 1.

Additionally, as discussed above, for both the entropy encoding process 300 and the entropy decoding process 400, if b=1, then rounding (332) and (430) is unnecessary. Moreover, if the probability denominator M is not a power of 2, then the encoder must write bits in a way that matches the decoder's reading pattern. For example, if the decoder will first read G bits, then b bits, then the encoder should first dump b bits, then G bits.

Further, if the probability denominator M is a power of 2, the check to determine if the new state with $X_{k-1}$ is still below the lower bound I (434) will always be "No". Accordingly, the "Yes" branch from the check (434) never occurs, and thus, only one read from the bitstream memory is required when decoding. Additionally, the encoder will not have to check if it must first dump b bits, then G bits in order to match the way decoder's reading pattern.

Figure 5:
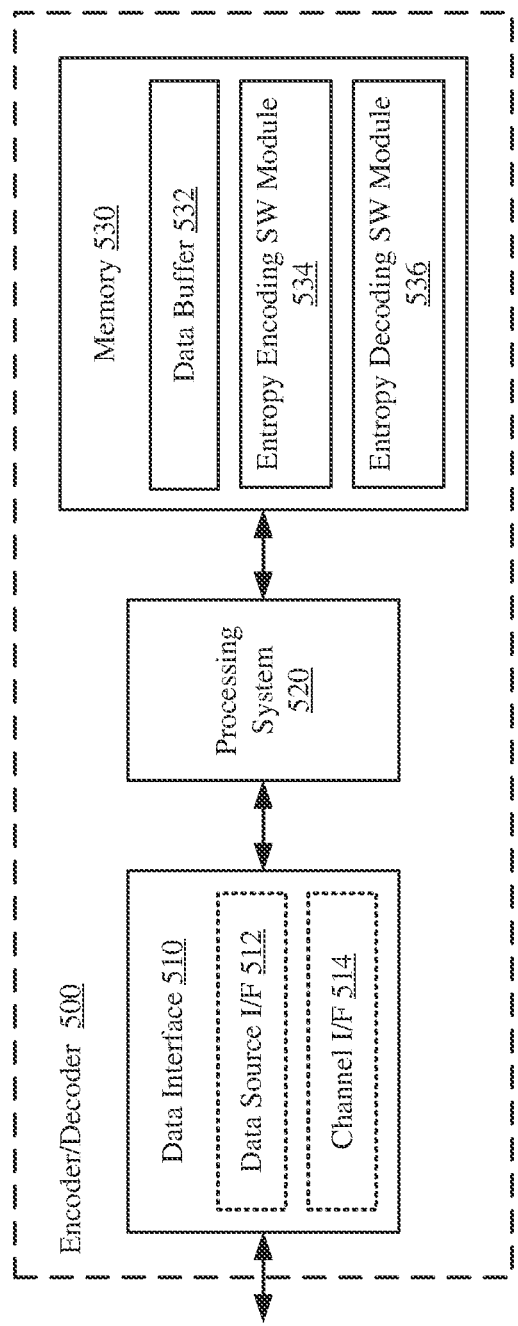
FIG. 5 shows a block diagram of an encoder/decoder, according to some implementations.

FIG. 5 shows a block diagram of an encoder/decoder 500, according to some implementations. The encoder/decoder 500 may be one example of any of the encoder 110 or decoder 120 of FIG. 1. More specifically, the encoder/decoder 500 may be configured to encode and decode data symbols in accordance with an entropy encoding process 300 or entropy decoding process 400, and as discussed herein. In some implementations, the encoder and the decoder may be separate entities.

In some implementations, the encoder 500 may include a data interface 510, a processing system 520, and a memory 530. The data interface 510 is configured to receive the data symbols and probabilities and to output encoded data and probability tables associated with the data symbols, when functioning as an encoder and to receive encoded data and probability tables associated with data symbols and to output decoded data when functioning as a decoder. In some aspects, the data interface 510 may include a data input/output interface (I/F) 512 and a channel interface 514. The data source input/output interface 512 is configured to communicate with a data source coupled to or otherwise associated with the encoder/decoder 500 functioning as an encoder or to communicate with a data receiving device coupled to or otherwise associated with the encoder/decoder 500 functioning as a decoder. The channel interface 514 is configured to communicate over the channel with another encoder or decoder. For example, the channel interface 514 may transmit the encoded data and probability tables, via the channel, to the decoder when functioning as an encoder or to receive the encoded data and probability tables, via the channel, from the encoder when functioning as a decoder.

The memory 530 may include a data buffer 532 configured to store the data symbols and any intermediate data associated with the encoding operation or decoding operation. The memory 530 also may include a non-transitory computer-readable medium (including one or more nonvolatile memory elements, such as EPROM, EEPROM, Flash memory, a hard drive, and the like) that may store one or more of software (SW) modules that contain executable code or software instructions that when executed by the processing system 520 cause the one or more processors in the processing system 520 to operate as a special purpose computer programmed to perform the techniques disclosed herein. While the components or modules are illustrated as software in memory 530 that is executable by the one or more processors in the processing system 520, it should be understood that the components or modules may be stored in memory 530 or may be dedicated hardware either in the one or more processors of the processing system 520 or off the processors. It should be appreciated that the organization of the contents of the memory 530 as shown in encoder/decoder 500 is merely exemplary, and as such the functionality of the modules and/or data structures may be combined, separated, and/or be structured in different ways depending upon the implementation of the encoder/decoder 500.

Figure 6:
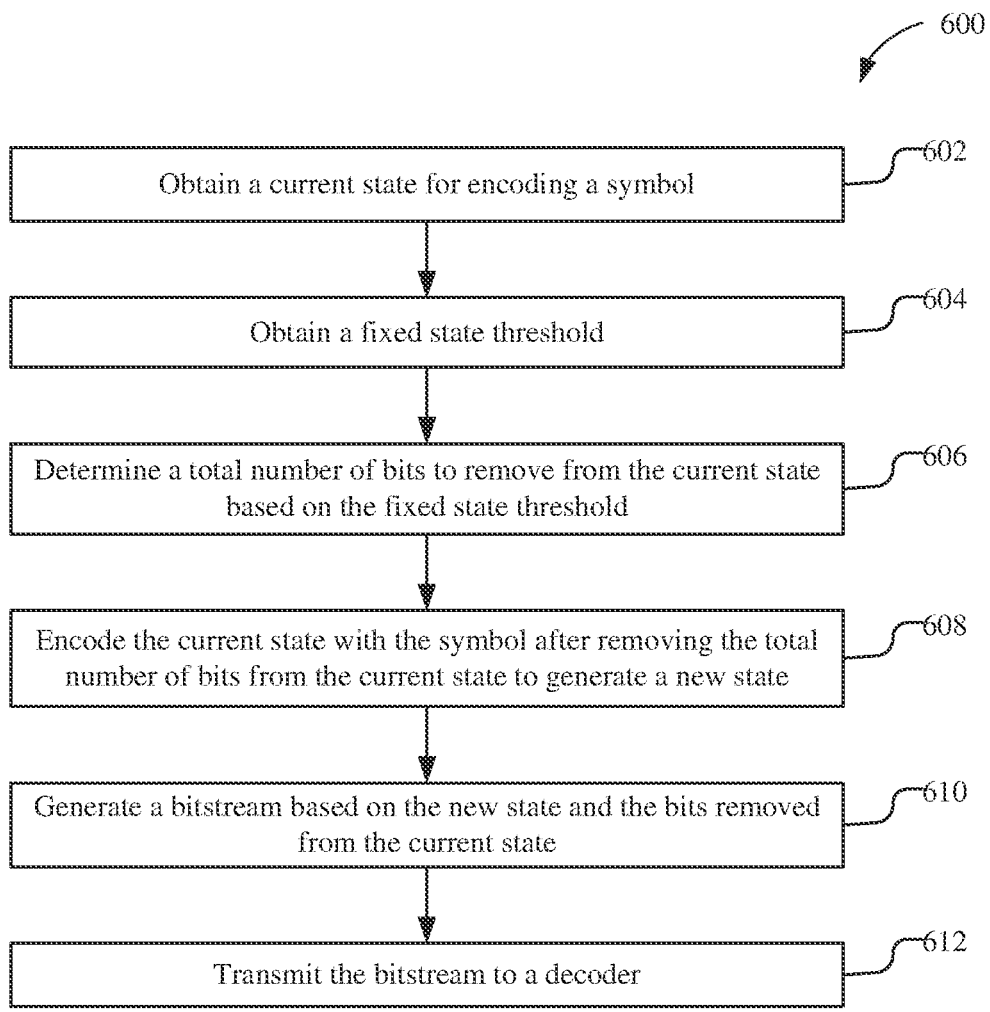
FIG. 6 shows an illustrative flowchart depicting an example operation for data encoding, according to some implementations.

The memory 530 may include an entropy encoding SW module 534 that when implemented by the processing system 520 configures one or more processors to encode a plurality of data symbols using a noniterative approach to keep the size of the state variable less than an upper bound before data symbols are encoded as discussed herein, and in particular in reference to the entropy encode process 300 shown in FIG. 3 and the method 600 shown in FIG. 6.

Figure 7:
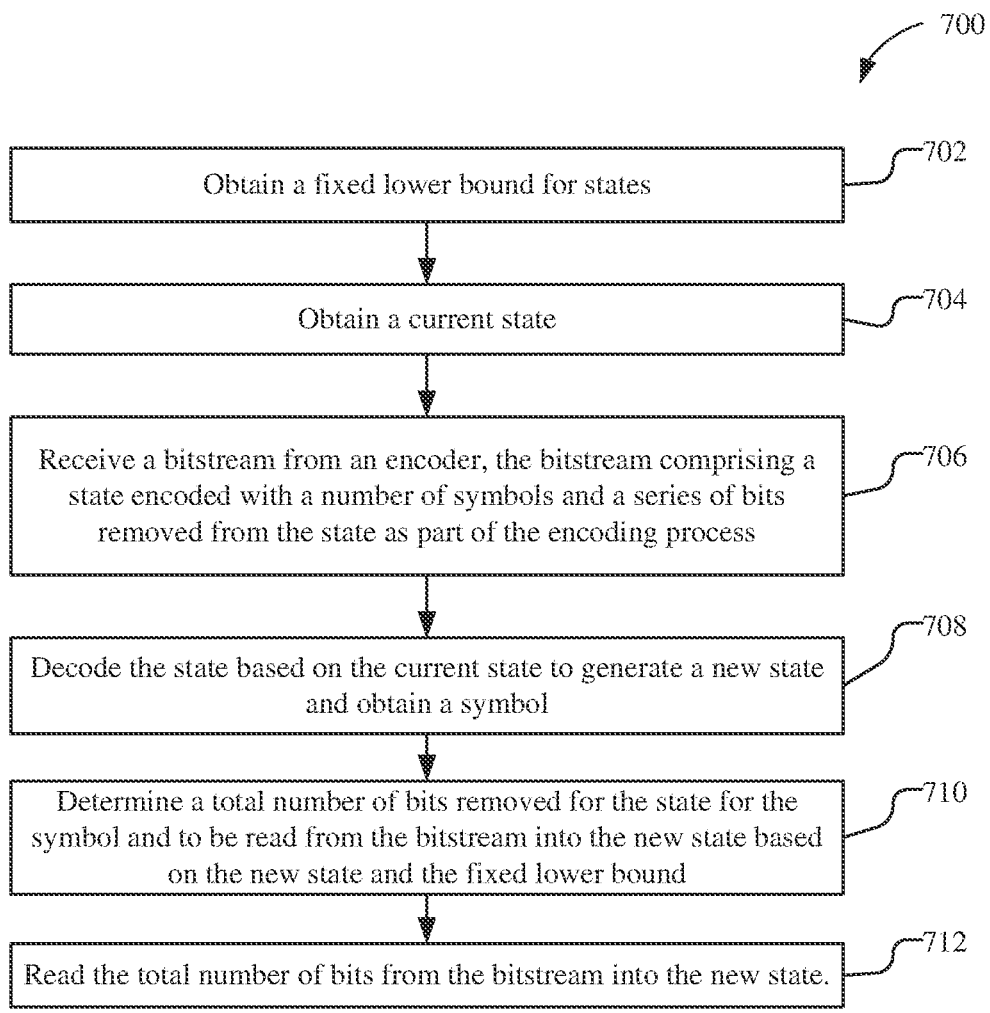
FIG. 7 shows an illustrative flowchart depicting an example operation for data decoding, according to some implementations.

The memory 530 may include an entropy decoding SW module 536 that when implemented by the processing system 520 configures one or more processors to decode encoded states to produce a plurality of data symbols using a noniterative approach to keep the size of the state variable more than or equal to a lower bound after symbols are decoded as discussed herein, and in particular in reference to the entropy decode process 400 shown in FIG. 4 and the method 700 shown in FIG. 7.

Each software module includes instructions that, when executed by the one or more processors of the processing system 520, cause the encoder/decoder 500 to perform the corresponding functions. The non-transitory computer-readable medium of memory 530 thus includes instructions for performing all or a portion of the operations described below with respect to FIG. 6 or 7.

FIG. 6 shows an illustrative flowchart depicting an example operation 600 for data encoding, according to some implementations. In some implementations, the example operation 600 may be performed by an entropy encoder such as any of the encoders 110 or 500 of FIGS. 1 and 5, respectively, configured to implement the noniterative entropy encode process discussed herein, and in particular the entropy encode process 300 shown in FIG. 3.

The encoder may obtain a current state for encoding a symbol (602), such as illustrated by block 326 in FIG. 3. The encoder may further obtain a fixed state threshold (604), such as illustrated by block 324 in FIG. 3. The encoder determines a total number of bits to remove from the current state based on the fixed state threshold (606), e.g., as illustrated by blocks 322, 328, 330, 332, 334, and 338 in FIG. 3. The encoder encodes the current state with the symbol after removing the total number of bits from the current state to generate a new state (608), e.g., as illustrated by block 340 in FIG. 3. The encoder generates a bitstream based on the new state and the bits removed from the current state (610), e.g., as illustrated by blocks 360 and 370 in FIG. 3. For example, in some implementations, e.g., when multiple encodes are performed, a final new state may be generated based on previously determined new states and the bitstream may include only the final new state and the bits removed from previously determined new states. The encoder transmits the bitstream to a decoder (612), e.g., as discussed in reference to block 370 in FIG. 3.

In some aspects, the fixed state threshold may be obtained based on an upper bound for states divided by a fixed denominator of probabilities associated with symbols to be encoded, e.g., as discussed in reference to block 324 in FIG. 3.

In some aspects, the encoder determines the total number of bits to remove from the current state based on the fixed state threshold by generating a threshold associated with the symbol based on the fixed state threshold and a probability of the symbol, e.g., as illustrated by block 322 in FIG. 3, and determining if the current state is above the threshold associated with the symbol, e.g., as illustrated by block 328 of FIG. 3. For example, in response to determining the current state is not above the threshold associated with the symbol, the total number of bits to remove from the current state is zero, e.g., as discussed in reference to blocks 328 and 340 shown in FIG. 3. For example, if the current state is above the threshold associated with the symbol, the encoder determines the total number of bits to remove from the current state by determining a number of bits based on a difference in leading 0s of the current state and the threshold associated with the symbol and rounding up to an integer number of words, where a word is a fixed size group of bits handled as a unit, e.g., as discussed in reference to blocks 330, 332 shown in FIG. 3. Additionally, if the current state after removing the number of bits is below the threshold associated with the symbol, the total number of bits is the number of bits, e.g., as discussed in reference to blocks 334 and 336 shown in FIG. 3, and if the current state after removing the number of bits is above the threshold associated with the symbol, the total number of bits is the number of bits increased by one word, e.g., as discussed in reference to blocks 334, 338, and 336 shown in FIG. 3.

In some aspects, the encoder may further repeat the method of data encoding for each symbol, where for each subsequent symbol, the current state is defined as the new state for the previous symbol, e.g., as discussed in reference to blocks 350, 310, and 326 shown in FIG. 3.

FIG. 7 shows an illustrative flowchart depicting an example operation 700 for data decoding, according to some implementations. In some implementations, the example operation 700 may be performed by an entropy decoder such as any of the decoders 120 or 500 of FIGS. 1 and 5, respectively, configured to implement the noniterative entropy decode process discussed herein, and in particular the entropy decode process 400 shown in FIG. 4.

The decoder may obtain a fixed lower bound for states (702), such as illustrated by block 427 in FIG. 4. The decoder obtains a current state (704), such as illustrated by block 424 in FIG. 4. The decoder receives a bitstream from an encoder, the bitstream comprising a state encoded with a number of symbols and a series of bits removed from the state as part of the encoding process (706), e.g., as illustrated by block 404 in FIG. 4. For example, in some implementations, e.g., when multiple encodes were performed, the bitstream may include only a final new state which is generated based on a plurality of previously determined states and any bits removed from all previously determined states. The decoder decodes the state based on the current state to generate a new state and obtain a symbol (708), e.g., as illustrated by block 415 in FIG. 4. The decoder determines a total number of bits removed from the state for the symbol and to be read from the bitstream into the new state based on the new state and the fixed lower bound (710), e.g., as illustrated by blocks 426, 428, 430, and 434 in FIG. 4. The decoder reads the total number of bits from the bitstream into the new state (712), e.g., as illustrated by blocks 432 and 438 in FIG. 4.

In some aspects, the decoder determines the total number of bits removed for the state for the symbol based on the new state and the fixed lower bound by determining if the new state is below the fixed lower bound, e.g., as illustrated by block 426 in FIG. 4. For example, in response to determining the new state is not below the fixed lower bound, the total number of bits is zero, e.g., as discussed in reference to blocks 426 and 436 in FIG. 4. For example, in response to determining the new state is below the fixed lower bound, the decoder determines the total number of bits by determining a number of bits based on a difference in leading 0s of the new state and the fixed lower bound and an integer number of words, where a word is a fixed size group of bits handled as a unit, e.g., as discussed in reference to blocks 428, 430, and 434 in FIG. 4. Additionally, the decoder may determine if the new state after reading the number of bits from the bitstream into the new state is below the fixed lower bound, wherein in response to determining the new state after reading the number of bits from the bitstream into the new state is not below the fixed lower bound, the total number of bits is the number of bits, e.g., as discussed in reference to block 432, 434, and 436 in FIG. 4, and in response to determining the new state after reading the number of bits from the bitstream into the new state is below the fixed lower bound, the total number of bits is the number of bits increased by one word, e.g., as discussed in reference to block 432, 434, 438, and 436 in FIG. 4.

In some aspects, the decoder may repeat the method of data decoding for each symbol, where for each subsequent symbol, the current state is defined as the new state for the previous symbol, e.g., as discussed in blocks 440, 410, and 424.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method of data encoding, comprising:
obtaining a current state for encoding a symbol;
obtaining a fixed state threshold;
determining a total number of bits to remove from the current state based on the fixed state threshold;
encoding the current state with the symbol after removing the total number of bits from the current state to generate a new state;
generating a bitstream based on the new state and the bits removed from the current state; and
transmitting the bitstream to a decoder.

2. The method of claim 1, wherein the fixed state threshold is obtained based on an upper bound for states divided by a fixed denominator of probabilities associated with symbols to be encoded.

3. The method of claim 1, wherein determining the total number of bits to remove from the current state based on the fixed state threshold comprises:
generating a threshold associated with the symbol based on the fixed state threshold and a probability of the symbol; and
determining if the current state is above the threshold associated with the symbol.

4. The method of claim 3, wherein, in response to determining the current state is not above the threshold associated with the symbol, the total number of bits to remove from the current state is zero.

5. The method of claim 3, wherein, in response to determining the current state is above the threshold associated with the symbol, determining the total number of bits to remove from the current state comprises:
determining a number of bits based on a difference in leading 0s of the current state and the threshold associated with the symbol and rounding up to an integer number of words, wherein a word is a fixed size group of bits handled as a unit.

6. The method of claim 5, further comprising determining if the current state, after removing the number of bits, is below the threshold associated with the symbol, wherein:

in response to determining the current state, after removing the number of bits, is below the threshold associated with the symbol, the total number of bits is the number of bits; and in response to determining the current state, after removing the number of bits, is not below the threshold associated with the symbol, the total number of bits is the number of bits increased by one word.

7. The method of claim 1, further comprising repeating the method of data encoding for each symbol, wherein for each subsequent symbol, the current state is defined as the new state for a previous symbol.

8. An encoder configured for data encoding, comprising:
at least one memory; and
a processing system comprising one or more processors coupled to the at least one memory, the processing system configured to:
obtain a current state for encoding a symbol;
obtain a fixed state threshold;
determine a total number of bits to remove from the current state based on the fixed state threshold;
encode the current state with the symbol after removing the total number of bits from the current state to generate a new state;
generate a bitstream based on the new state and the bits removed from the current state; and
transmit the bitstream to a decoder.

9. The encoder of claim 8, wherein the fixed state threshold is obtained based on an upper bound for states divided by a fixed denominator of probabilities associated with symbols to be encoded.

10. The encoder of claim 8, wherein the processing system is configured to determine the total number of bits to remove from the current state based on the fixed state threshold by being configured to:
generate a threshold associated with the symbol based on the fixed state threshold and a probability of the symbol; and
determine if the current state is above the threshold associated with the symbol.

11. The encoder of claim 10, wherein, in response to a determination that the current state is not above the threshold associated with the symbol, the total number of bits to remove from the current state is zero.

12. The encoder of claim 10, wherein, in response to a determination that the current state is above the threshold associated with the symbol, the processing system is configured to determine the total number of bits to remove from the current state by being configured to:
determine a number of bits based on a difference in leading 0s of the current state and the threshold associated with the symbol and an integer number of words, wherein a word is a fixed size group of bits handled as a unit.

13. The encoder of claim 12, wherein the processing system is further configured to determine if the current state, after removing the number of bits, is below the threshold associated with the symbol, wherein:

in response to a determination that the current state, after removing the number of bits, is below the threshold associated with the symbol, the total number of bits is the number of bits; and in response to a determination that the current state, after removing the number of bits, is not below the threshold associated with the symbol, the total number of bits is the number of bits increased by one word.

14. The encoder of claim 8, wherein the processing system is further configured to repeat the data encoding for each symbol, wherein for each subsequent symbol, the current state is defined as the new state for a previous symbol.

15. A method of data decoding, comprising:
obtaining a fixed lower bound for states;
obtaining a current state;
receiving a bitstream from an encoder, the bitstream comprising a state encoded with a number of symbols and a series of bits removed from the state as part of an encoding process;
decoding the state based on the current state to generate a new state and obtain a symbol;
determining a total number of bits removed for the state for the symbol and to be read from the bitstream into the new state based on the new state and the fixed lower bound; and
reading the total number of bits from the bitstream into the new state.

16. The method of claim 15, wherein determining the total number of bits removed for the state for the symbol based on the new state and the fixed lower bound comprises determining if the new state is below the fixed lower bound.

17. The method of claim 16, wherein, in response to determining the new state is not below the fixed lower bound, the total number of bits is zero.

18. The method of claim 16, wherein, in response to determining the new state is below the fixed lower bound, determining the total number of bits comprises:
determining a number of bits based on a difference in leading 0s of the new state and the fixed lower bound and an integer number of words, wherein a word is a fixed size group of bits handled as a unit.

19. The method of claim 18, further comprising determining if the new state after reading the number of bits from the bitstream into the new state is below the fixed lower bound, wherein:
in response to determining the new state after reading the number of bits from the bitstream into the new state is not below the fixed lower bound, the total number of bits is the number of bits; and
in response to determining the new state after reading the number of bits from the bitstream into the new state is below the fixed lower bound, the total number of bits is the number of bits increased by one word.

20. The method of claim 15, further comprising repeating the method of data decoding for each symbol, wherein for each subsequent symbol, the current state is defined as the new state for a previous symbol.

* * * * *